US006193561B1

(12) United States Patent

Harting et al.

(10) Patent No.: US 6,193,561 B1

(45) Date of Patent: Feb. 27, 2001

(54) ELECTRICAL PLUG CONNECTOR

(75) Inventors: Dietmar Harting, Espelkamp; Günter Pape, Enger; Dieter Lüttermann, Lübbecke, all of (DE)

(73) Assignee: Harting KGaA (DE)

(*) Notice: Subject to any disclaimer, the term of this patent is extended or adjusted under 35 U.S.C. 154(b) by 0 days.

(21) Appl. No.: 09/305,582

(22) Filed: May 5, 1999

(30) Foreign Application Priority Data

May 6, 1998 (DE) ........................................... 198 20 144

(51) Int. Cl.[7] ........................... H10R 13/10; H10R 33/00

(52) U.S. Cl. ............................................................ 439/682

(58) Field of Search .................................... 439/682, 856, 439/857

(56) References Cited

U.S. PATENT DOCUMENTS 3,601,775 * 8/1971 Longenecker et al. .............. 439/636
3,790,924 * 2/1974 Sauer .................................. 439/857
4,033,656 * 7/1977 Freehauf et al. ..................... 439/525
5,611,700 * 3/1997 Mitra ................................... 439/101
6,048,230 * 4/2000 Kikuchi ............................... 439/682

FOREIGN PATENT DOCUMENTS

OS 18 13 739 12/1968 (DE) .

* cited by examiner

*Primary Examiner*—Lincoln Donovan
*Assistant Examiner*—Brian S. Webb
(74) *Attorney, Agent, or Firm*—Cook, Alex, McFarron, Manzo, Cummings & Mehler, Ltd.

(57) ABSTRACT

For an electrical plug connector with one-piece contact elements which are disposed in contact chambers and have spring legs with an embossed contour which are disposed in a mirror-inverted manner, it is proposed that the spring legs be constructed in such a way that they are at a distance from the contact chamber walls when the contact elements are inserted in the contact chambers, the spring legs being deflected in such a way, when a contact pin is inserted in the contact elements, that the said spring legs are supported on the contact chamber walls.

2 Claims, 4 Drawing Sheets

ELECTRICAL PLUG CONNECTOR

THE FIELD OF THE INVENTION

The invention relates to an electrical plug connector with contact elements disposed in contact chambers, spring legs of the contact elements, which spring legs are provided with an embossed contour, being disposed in a mirror-inverted manner.

Plug connectors of this kind are used as circuit board plug connectors. What is aspired to, in this connection, is to increase the number of contact elements of a plug connector to an ever-greater extent, but to reduce the size of the plug connector itself to an ever-greater extent. In order to enable two-legged spring contact elements to be manufactured in an economical manner, even in the case of small grid intervals of <2 mm, it is necessary to punch these out of a continuous metal strip beforehand in the particular mounting grid. Because of the resultant closeness of the intervals, however, it is difficult to design the contact in a two-sided manner since the said contact no longer fits, from the development point of view, into a small punching grid in the case of conventional contact elements with a U-shaped or folded contact body. This particularly applies to designs of plug connector for the surface soldering technique (surface-mounted technology—SMT), in which the size of the components that can be surface-mounted (surface-mounted devices, SMD's) is kept very shallow and very small and the number of contacts can scarcely be reduced. In addition, the plugging-in force of the plug connector rises as the number of contacts increases.

DESCRIPTION OF THE RELATED ART

From DE-OS 18 13 739, a plug connector for printed circuits is known which has spring legs with an embossed contour disposed in a mirror-inverted manner in its contact chambers, the contact elements or their spring legs being constructed in such a way that they are supported on the contact walls in the rest condition. In this plug connector, no contact-making between the spring legs and a contact pin which is introduced comes about in the first half of the plugging-in region, and the said contact-making takes place only when the contact pin is almost completely inserted, under which circumstances high plugging-in forces occur.

SUMMARY OF THE INVENTION

The underlying object of the invention is to construct a plug connector of the initially mentioned type to the effect that, in spite of the contact forces and number of contacts remaining the same, the plugging-in forces are reduced, compared with conventional plug connectors, a low contact pressure of the spring legs being initially exerted on the blade contacts on insertion of the said blade contacts in the contact elements of the contact chambers, so that easy insertion of the counter-plug is achieved—but immediate, reliable contact-making is guaranteed at the same time—and that the maximum contact forces operate only when the blade contacts are completely introduced.

This object is achieved through the fact that the spring legs are constructed in such a way that they are at a distance from the contact chamber walls when the contact elements are inserted in the contact chambers, the spring legs being deflected in such a way, when a contact pin is inserted in the contact elements, that the said spring legs are supported on the contact chamber walls.

An advantageous refinement of the invention is indicated in claim 2.

The advantages obtained by means of the invention consist, in particular, in the fact that the plugging-in forces of the plug connector according to the invention are lower, compared with conventional plug connectors. This is achieved through the fact that, during the pushing-in of a counter-plug (blade strip), the spring legs are deflected with low force because of a lower active spring length and a narrow spring root. As a result of a suitably formed contour, the spring legs are then supported on the contact chamber walls and produce, in a manner brought about by a shorter active spring length in conjunction with the broader contact legs, an increased spring force which is necessary for reliable contact-making.

BRIEF DESCRIPTION OF THE DRAWINGS

An exemplified embodiment of the invention is represented in the drawings and will be described in greater detail below. In the drawings.

DESCRIPTION OF THE PREFERRED EMBODIMENT

Figure 1:
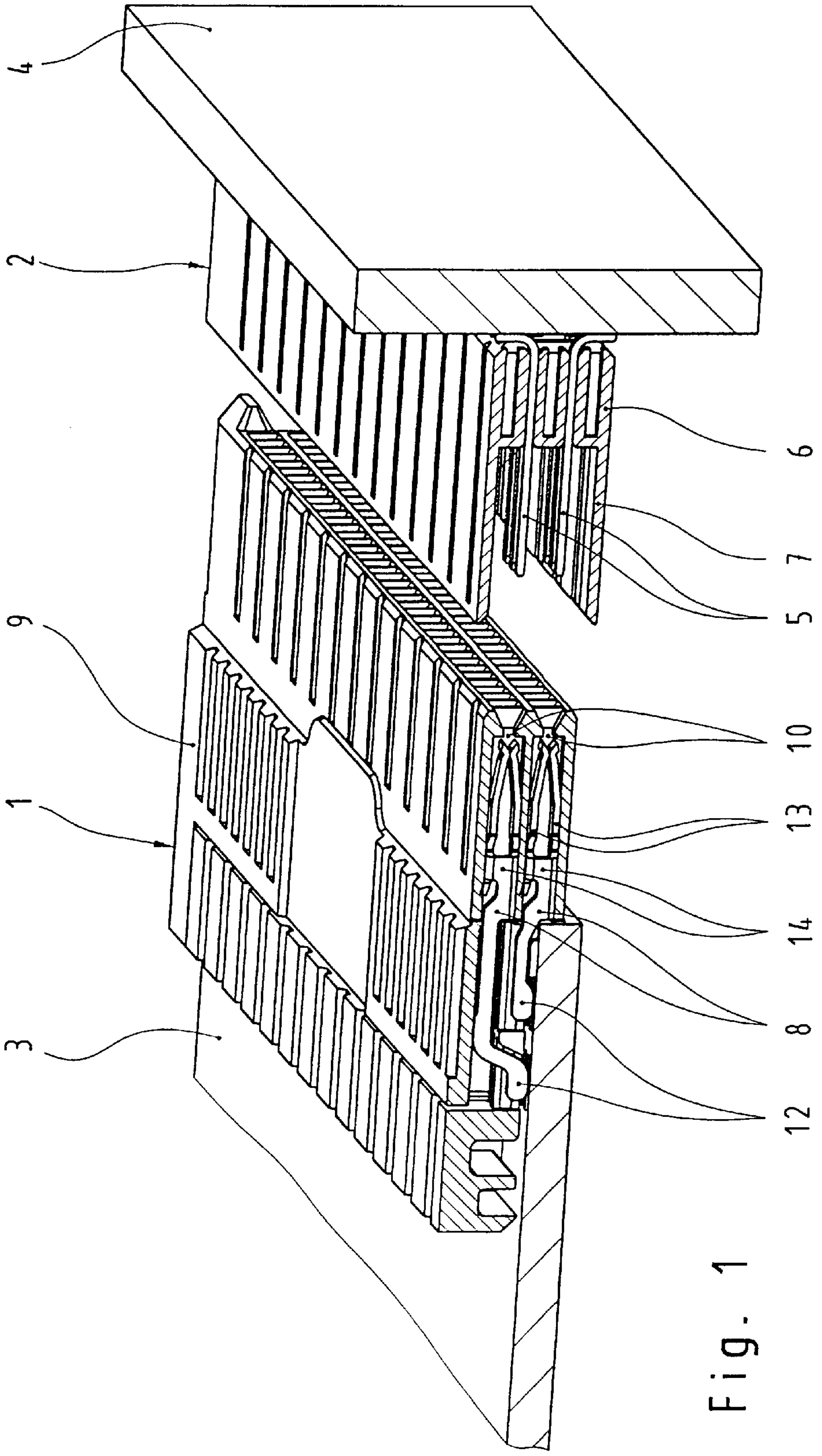
FIG. 1 shows a perspective representation of a plug connector and of a counter-plug in the non-plugged-in condition.

FIG. 1 represents a plug connection which consists of a plug connector 1 and a counter-plug 2 and serves to electrically connect a printed circuit board 3 (represented diagrammatically without electronic components) to another circuit board 4. The plug connection contains a counter-plug 2 which is constructed as a blade strip and is soldered to the circuit board 4, and also a plug connector 1 which is constructed as a spring strip and is connected to the circuit board 3. Connected to the circuit board 4 are single-row or multi-row signal contacts (blade contacts) 5 which are configured as pins and project upwards through the base 6 of the insulating body 7 of the counter-plug 2 (the rest of the design of the counter-plug 2 will not be described in any greater detail here), in order to interact with a corresponding number of resilient contact elements 8 which are located in recesses in an insulating body 9, with corresponding contact chambers 10. The contact element 8 has a fixed region, the so-called "fixed seat" 11, with the aid of which the contact elements 8 are fixedly anchored in the contact chambers 10 of the plug connector 1. Also visible is a circuit-board connection 12 to the circuit board 3. This connection may be made, as represented, by the surface soldering technique (surface-mounted technology, SMT) or by the conventional pressing-in technique.

Figure 2:
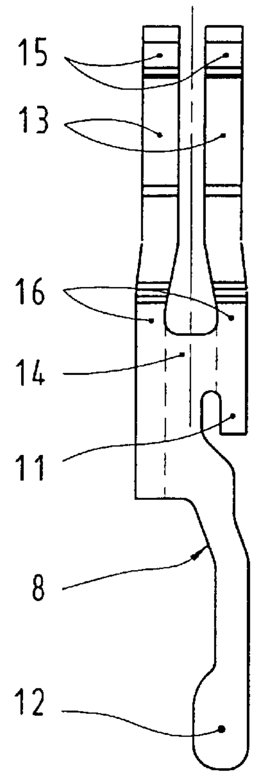
FIG. 2 shows the contour of a contact element stamped out of strip material.
Figure 3:
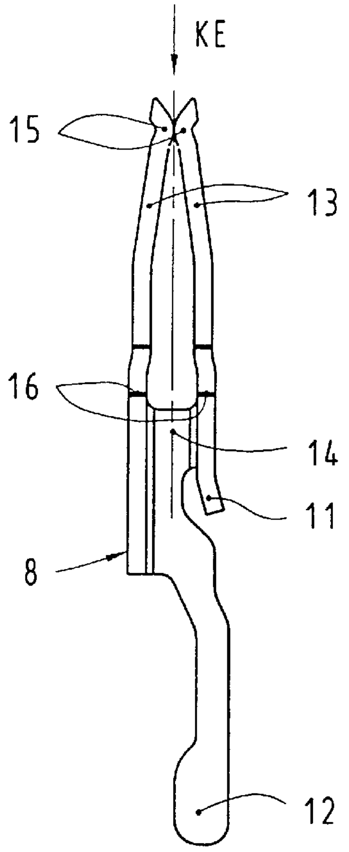
FIG. 3 shows the top view of a contact element.
Figure 4:
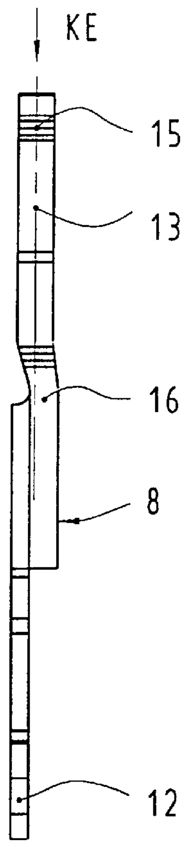
FIG. 4 shows the side view of the contact element according to FIG. 3.
Figure 5:
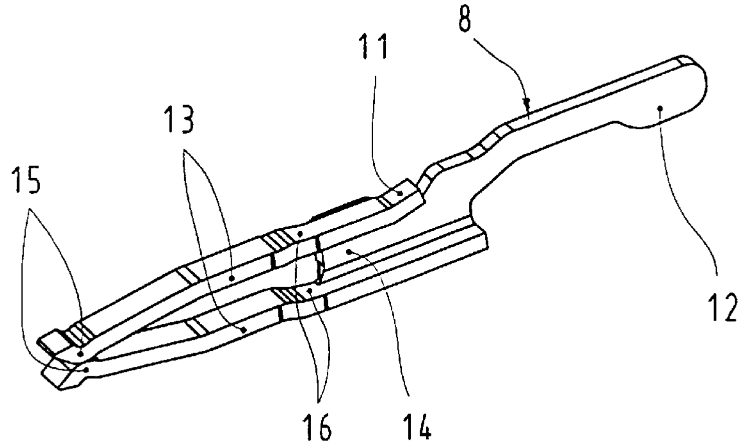
FIG. 5 shows the perspective view of the contact element according to FIG. 3.

The contact element 8 represented in FIGS. 2 to 5 is provided, as a one-piece, two-legged contact spring, with a spring leg connection 14 and with contact domes 15 located opposite one another in a mirror-inverted manner and, as represented in FIG. 2, is initially manufactured by continuous stamping operations from a metal strip, with a narrowed spring root 16 and broadened spring legs 13. The contact element is then brought into the form represented in FIGS. 3 to 5 by embossing-type bending operations.

Figure 6:
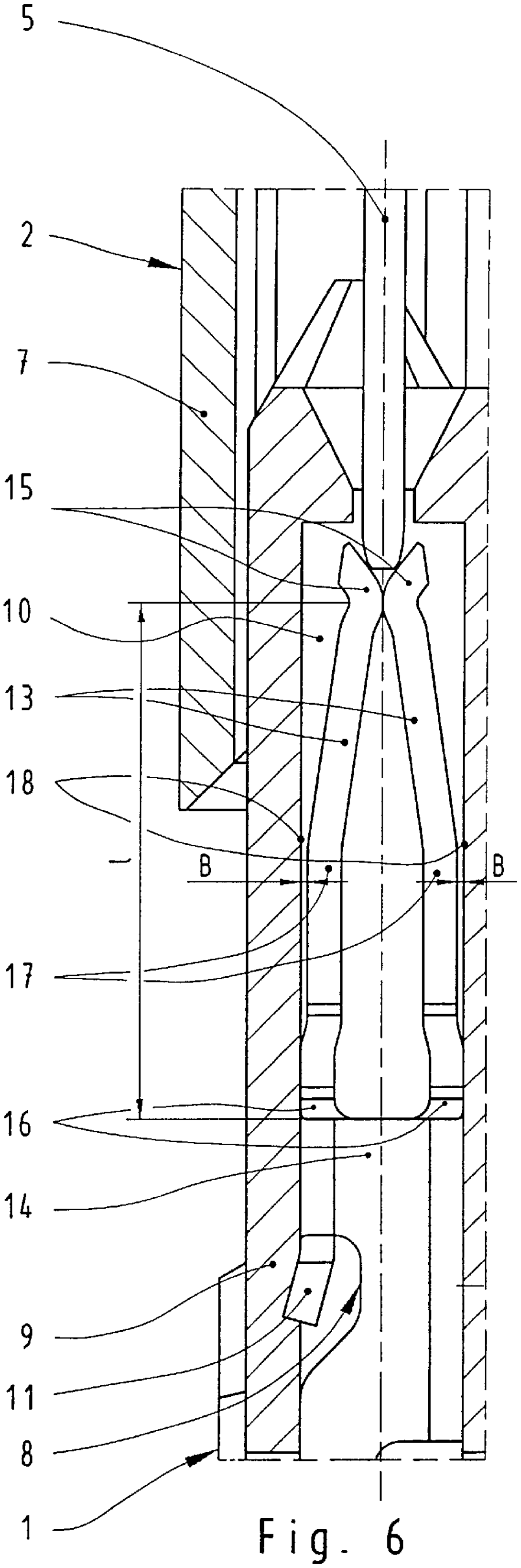
FIG. 6 shows a partial view of a plug connector and a counter-plug in the not-yet-plugged-in condition.

FIG. 6 represents a plug connection in which the blade contacts 5 of the counter-plug 2 have not yet been introduced into the contact elements 8 of the plug connector 1. Here it can be seen that there is a small distance (B) between the contact chamber walls 18 and the contact legs 13 because of a corresponding contour 17. The moment the blade contacts 5 of the counter-plug 2 are pushed into the contact entrance (KE) of the contact elements 8, the spring legs 13 are deflected laterally with a slight force, low plug-in forces being obtained because of the combination of a long active spring length (l) and a narrow spring root 16.

Figure 7:
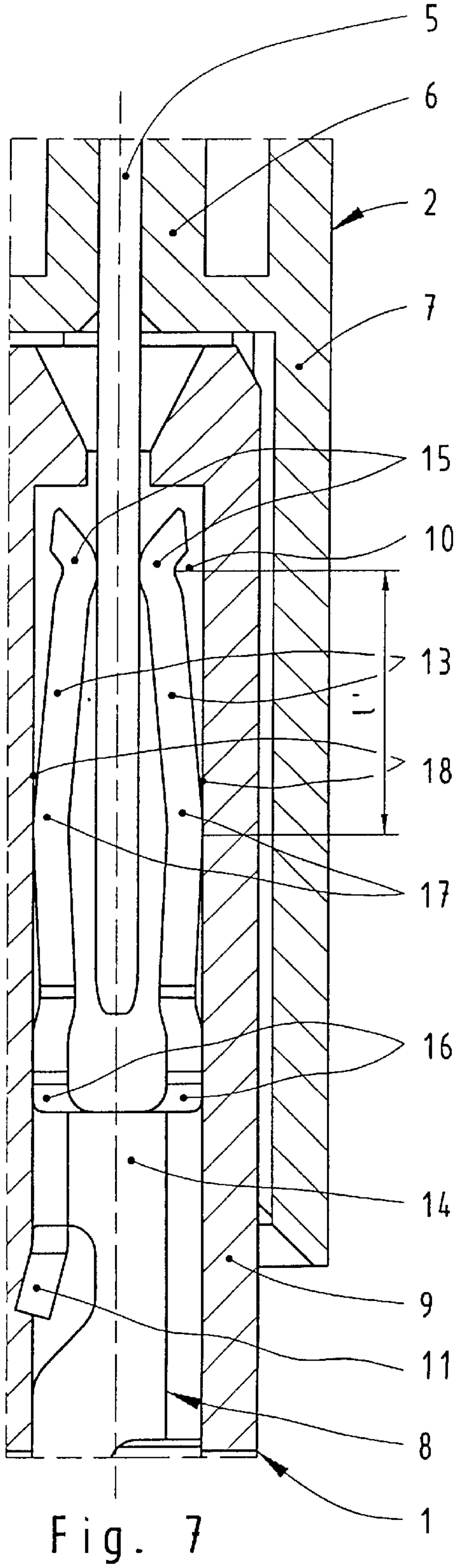
FIG. 7 shows the partial view of the plug connector and counter-plug according to FIG. 6, in the plugged-in condition.

FIG. 7 shows the plug connection in which the blade contacts of the counter-plug 2 have been introduced into the contact element 8 of the plug connector 1. Here it can be seen that, when the blade contacts 5 are pushed in further, the spring legs 13 press, with their contour 17, against the contact chamber walls 18. What is achieved as a result of this is that the contact force is increased because of the shorter active spring length (l') and the broader spring legs 13.

Figure 8:
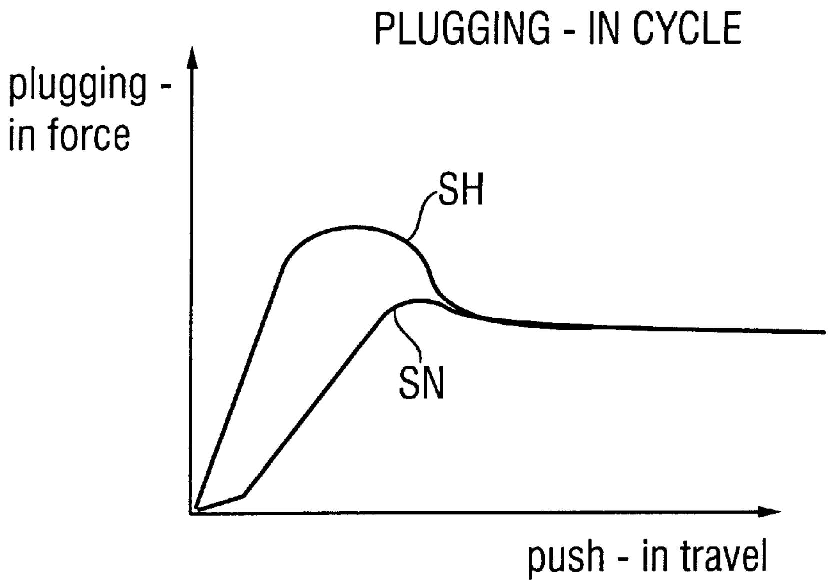
FIG. 8 shows a chart of the plugging-in forces of a conventional plug connector and of a plug connector according to the invention.

In order to illustrate the plugging-in behaviour of a conventional plug connector and of a plug connector according to the invention, the curve of the plugging-in force of the plug connector is plotted over the push-in travel in a chart in FIG. 8. In this chart, it becomes apparent that the plugging-in force (SH) of a conventional plug connector has a substantially steeper curve and also a greater height than the plugging-in force (SN) of a plug connector according to the invention.

Figure 9:
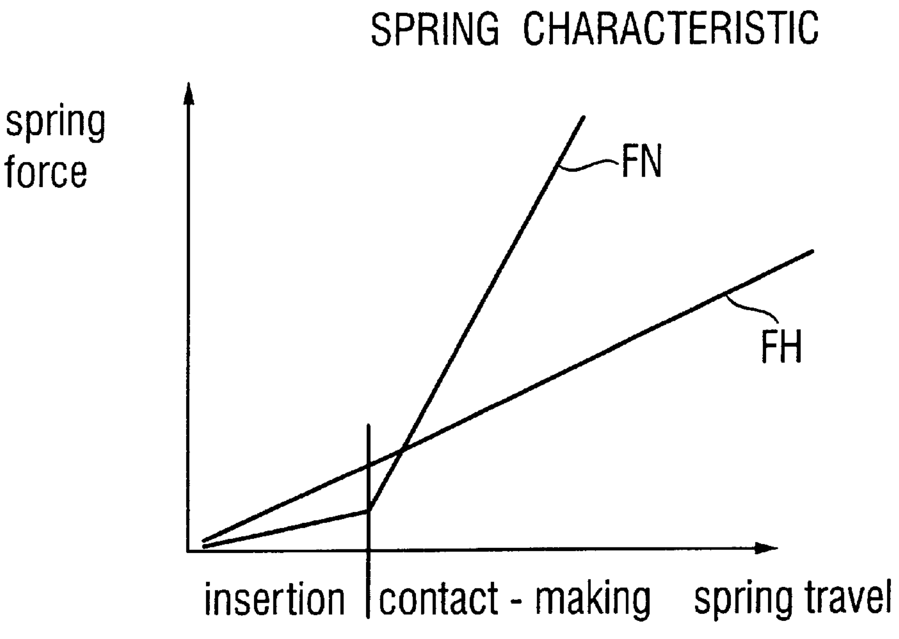
FIG. 9 shows a chart of the spring forces of the contact spring legs of a conventional plug connector and of a plug connector according to the invention.

FIG. 9 represents, in another chart, the spring forces of the spring legs of a contact element of conventional structural type, and of a contact element/plug connector according to the invention. As can be seen, the spring force (FH) of the spring legs rises in a linear manner in conventional plug connectors, whereas the spring force (FN) of the spring legs of the contact element/plug connector according to the invention initially rises at a slight inclination and rises steeply when the spring legs rest on the contact chamber walls.

What is claimed is:

1. Electrical plug connector with contact elements (8) disposed in contact chambers (10), spring legs (13) of the contact elements (8) are provided with an embossed contour, being disposed in a mirror-inverted manner, characterized in that the spring legs (13) have a bend (17) that is spaced a distance B from contact chamber walls (18) and the spring legs (13) having an active spring length (1) prior to insertion of contact elements (8) into contact chambers (10); insertion of a contact pin into the contact elements (8) moving the spring legs apart, with the bend (17) of each leg contacting a chamber wall (18) with the result that the bend (17) defines a second, shorter active spring length for the spring legs (13), to the end that the spring force of the spring legs (13) initially rises at a slower rate and thereafter rises at a steeper rate after the bend 17 contacts the chamber wall 18.

2. Electrical plug connector according to claim 1, characterised in that the spring legs (13) have a narrowed spring root (16).

* * * * *